(12) United States Patent
Chen et al.

(10) Patent No.: US 12,341,518 B2
(45) Date of Patent: Jun. 24, 2025

(54) LATCH

(71) Applicant: Realtek Semiconductor Corporation, Hsinchu (TW)

(72) Inventors: Yun-Tse Chen, Hsinchu (TW); Ying-Cheng Wu, Hsinchu (TW); Chia-Wei Yu, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 90 days.

(21) Appl. No.: 18/331,934

(22) Filed: Jun. 9, 2023

(65) Prior Publication Data

US 2024/0186990 A1 Jun. 6, 2024

(30) Foreign Application Priority Data

Dec. 5, 2022 (TW) .................................. 111146636

(51) Int. Cl.
*H03K 3/037* (2006.01)
*H03K 3/012* (2006.01)
*H03K 19/20* (2006.01)

(52) U.S. Cl.
CPC ............. *H03K 3/037* (2013.01); *H03K 3/012* (2013.01); *H03K 19/20* (2013.01)

(58) Field of Classification Search
CPC ........ H03K 3/037; H03K 3/012; H03K 19/20; H03K 3/0372; H03K 3/0375; H03K 3/0377; H03K 3/353; H03K 3/356; H03K 3/356017; H03K 3/356086; H03K 3/356104; H03K 3/356113; H03K 3/356182; H03K 3/3562; H03K 3/35625; H03K 3/3565
See application file for complete search history.

(56) References Cited

U.S. PATENT DOCUMENTS

2009/0079483 A1* 3/2009 Keskin ................... H03K 3/037 326/104
2011/0025375 A1* 2/2011 Takayanagi ........ H03K 19/0013 327/404

FOREIGN PATENT DOCUMENTS

CN 1953328 A 4/2007
TW I299938 B 8/2008

* cited by examiner

*Primary Examiner* — Jung Kim
(74) *Attorney, Agent, or Firm* — CKC & Partners Co., LLC (57) ABSTRACT

A latch includes at least one first standard cell logic gate and at least one second standard cell logic gate. The first standard cell logic gate includes a first input terminal, a second input terminal, a third input terminal, and a first output terminal. The second standard cell logic gate includes a fourth input terminal, a fifth input terminal, a sixth input terminal, and a second output terminal. The first input terminal and the second input terminal receive a first input signal. The third input terminal receives a first output signal. The first output terminal outputs a second output signal. The fourth input terminal receives the second output signal. The fifth input terminal and the sixth input terminal receive a second input signal. The second output terminal outputs the first output signal.

7 Claims, 10 Drawing Sheets

LATCH

RELATED APPLICATIONS

This application claims priority to Taiwanese Application Serial Number 111146636, filed Dec. 5, 2022, which is herein incorporated by reference.

BACKGROUND

Technical Field

The present disclosure relates to standard cells. More particularly, the present disclosure relates to a latch implemented by standard cells that can speed up the rising time or the falling time of signals.

Description of Related Art

With developments of technology, circuit designers can use standard cells to design circuits. With evolution of manufacturing processes, sizes of the standard cells are shrinking and speed of the standard cells is faster. These make the overall circuit area and power consumption more advantageous.

SUMMARY

Some aspects of the present disclosure are to provide a latch. The latch includes at least one first standard cell logic gate and at least one second standard cell logic gate. The first standard cell logic gate includes a first input terminal, a second input terminal, a third input terminal, and a first output terminal. The second standard cell logic gate includes a fourth input terminal, a fifth input terminal, a sixth input terminal, and a second output terminal. The first input terminal and the second input terminal are configured to receive a first input signal. The third input terminal is configured to receive a first output signal. The first output terminal is configured to output a second output signal. The fourth input terminal is configured to receive the second output signal. The fifth input terminal and the sixth input terminal are configured to receive a second input signal. The second output terminal is configured to output the first output signal.

Some aspects of the present disclosure are to provide a latch. The latch includes at least one first standard cell logic gate and at least one second standard cell logic gate. The at least one second standard cell logic gate and the at least one first standard cell logic gate are coupled to each other. The at least one first standard cell logic gate includes a first group of transistors and a second group of transistors. The first group of transistors is coupled to each other in parallel and is configured to receive a first input signal and a first output signal. The second group of transistors is coupled to each other in series and is configured to receive the first input signal and the first output signal. The first group of transistors and the second group of transistors are coupled in series between a power source and a ground terminal, and are configured to output a second output signal. A transistor number of the first group of transistors is at least 3 and is equal to a transistor number of the second group of transistors.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
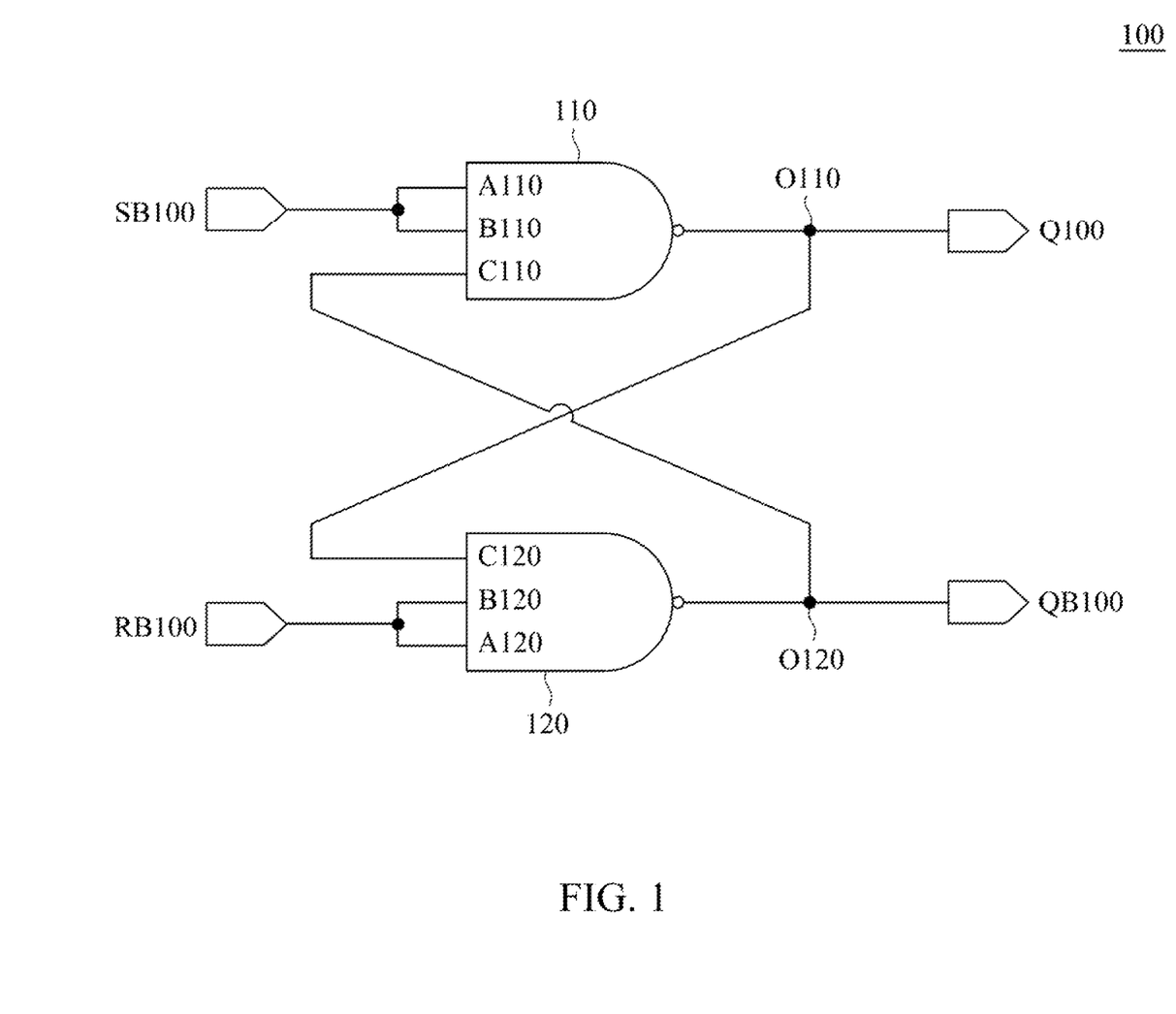
FIG. 1 is a schematic diagram of a latch according to some embodiments of the present disclosure.

Reference is made to FIG. 1. FIG. 1 is a schematic diagram of a latch 100 according to some embodiments of the present disclosure. As illustrated in FIG. 1, the latch 100 includes a standard cell logic gate 110 and a standard cell logic gate 120. The standard cell logic gate 110 and the standard cell logic gate 120 are coupled to each other.

In general, various standard cells (e.g., standard cell logic gates) can be stored in the standard cell library, and these standard cells can be provided by suppliers. Circuit designers can select the standard cells they want to use directly from the standard cell library to design circuits. In addition to convenience, since sizes of the standard cells are shrinking and speed of the standard cells is faster, using the standard cells to design circuits can achieve advantages of reducing area and improving speed.

In the example of FIG. 1, the standard cell logic gate 110 and the standard cell logic gate 120 are three-input NAND gates (NAND3). The standard cell logic gate 110 includes three input terminals A110, B110, C110 and one output terminal O110. The standard cell logic gate 120 includes three input terminals C120, B120, A120 and one output terminal O120.

The input terminal A110 and the input terminal B110 receive an input signal SB100. The input terminal C110 receives an output signal QB100. The output terminal O110 generates an output signal Q100. The input terminal C120 receives the output signal Q100. The input terminal B120 and the input terminal A120 receive an input signal RB100. The output terminal O120 generates the output signal QB100. The input signal SB100 can be an inverted set signal of the latch 100, and the input signal RB100 can be an inverted reset signal of the latch 100.

Figure 2:
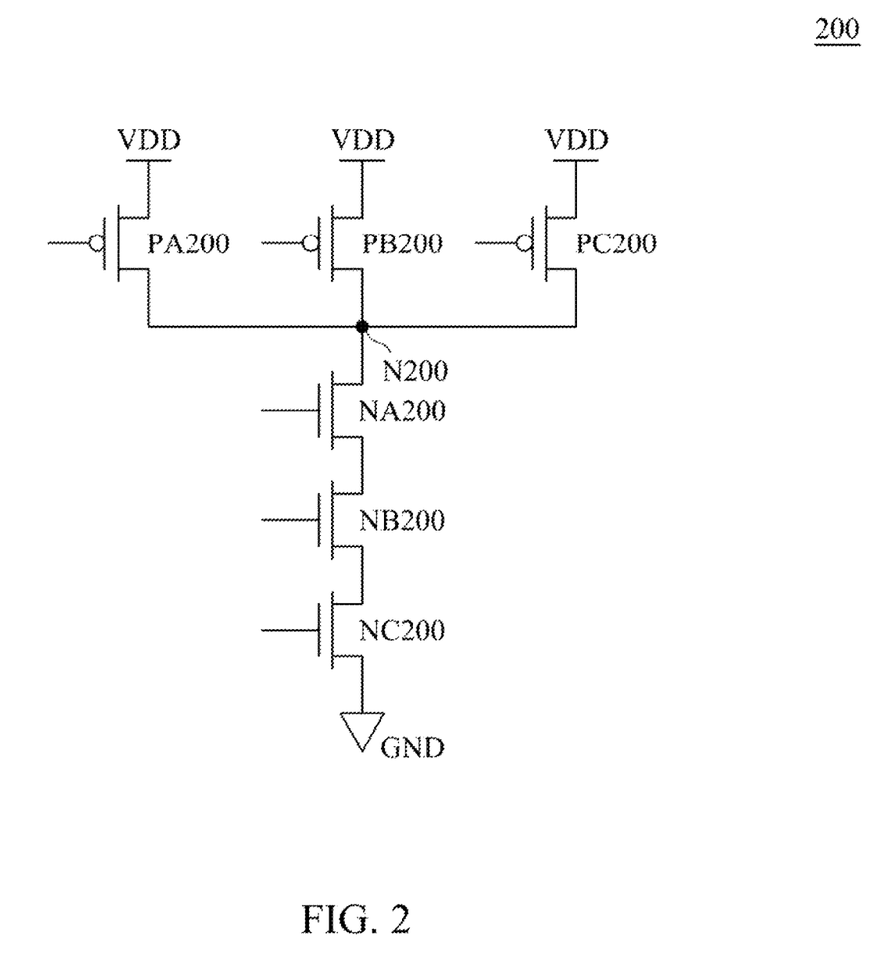
FIG. 2 is a schematic diagram of a standard cell logic gate according to some embodiments of the present disclosure.

Reference is made to FIG. 2. FIG. 2 is a schematic diagram of a standard cell logic gate 200 according to some embodiments of the present disclosure. The standard cell logic gate 200 can be used to implement the standard cell logic gate 110 or the standard cell logic gate 120 in FIG. 1.

As illustrated in FIG. 2, the standard cell logic gate 200 includes a group of transistors PA200, PB200, PC200 and a group of transistors NA200, NB200, NC200. Although the transistor number of each group of transistors in FIG. 2 is 3, the present disclosure is not limited thereto. In some other embodiments, the transistor number of each group of transistors can be greater than 3. In other words, the transistor number of each group of transistors is at least 3.

The transistors PA200, PB200, PC200 are P-type transistors and are coupled to each other in parallel. The transistors NA200, NB200, NC200 are N-type transistors (different from types of the transistors PA200, PB200, PC200) and are coupled to each other in series. The transistors PA200, PB200, PC200 and the transistors NA200, NB200, NC200 are coupled in series at a node N200, and coupled between a power source VDD and a ground terminal GND. The transistors PA200, PB200, PC200 are directly coupled to the power source VDD, and the transistor NC200 is directly coupled to the ground terminal GND.

In some embodiments, sizes of the transistors PA200, PB200, PC200 are identical to each other, sizes of the transistors NA200, NB200, NC200 are identical to each other, but the present disclosure is not limited thereto. The "size" of one transistor can refer to the "gate width" of the transistor. When the gate width is wider, the conduction current is larger.

When the standard cell logic gate 110 in FIG. 1 is implemented by the standard cell logic gate 200, a gate terminal of the transistor PA200 and a gate terminal of the transistor NA200 correspond to the input terminal A110 and receive the input signal SB100. A gate terminal of the transistor PB200 and a gate terminal of the transistor NB200 correspond to the input terminal B110 and receive the input signal SB100. A gate terminal of the transistor PC200 and a gate terminal of the transistor NC200 correspond to the input terminal C110 and receive the output signal QB100. The node N200 corresponds to the output terminal O110 and generates the output signal Q100.

When the standard cell logic gate 120 in FIG. 1 is implemented by the standard cell logic gate 200, the gate terminal of the transistor PA200 and the gate terminal of the transistor NA200 correspond to the input terminal A120 and receive the input signal RB100. The gate terminal of the transistor PB200 and the gate terminal of the transistor NB200 correspond to the input terminal B120 and receive the input signal RB100. The gate terminal of the transistor PC200 and the gate terminal of the transistor NC200 correspond to the input terminal C120 and receive the output signal Q100. The node N200 corresponds to the output terminal O120 and generates the output signal QB100.

Taking the standard cell logic gate 110 as an example, when the input signal SB100 has a lower logic value, the transistors PA200 and PB200 are turned on and the transistors NA200 and NB200 are turned off. Accordingly, the voltage of the output signal Q100 at the node N200 are pulled up by the power source VDD through the two turned-on transistors PA200 and PB200.

In some related approaches, the latch is implemented by two-input standard cell logic gate (e.g., NAND2). The voltage of the output signal in these some related approaches is pulled up by the power source through only one turned-on transistor. Accordingly, the rising time of the output signal in these some related approaches is slower (the rising time is longer).

Compared to the aforementioned related approaches, the voltage of the output signal Q100 in the present disclosure is pulled up by the power source VDD through the two turned-on transistors PA200 and PB200. Since the transistors PA200 and PB200 are coupled in parallel, the conduction current is equivalently doubled. Thus, the rising time of the output signal Q100 in the present disclosure can be speeded up (the rising time is shorter).

In addition, in some related approaches, even though the standard cell library is available for the circuit designer to adjust sizes of the standard cell logic gates, all of transistors (P-type and N-type) in a standard cell logic gate are adjusted when the circuit designer adjusts a size of this standard cell logic gate. This will change the rising time and the falling time of the output signal at the same time.

In the present disclosure, the voltage of the output signal Q100 is pulled down by the ground terminal GND through the transistors NA200, NB200, NC200 coupled in series during the discharging process. Since the transistors NA200, NB200, NC200 are coupled in series, the conduction current is not increased. In other words, the falling time of the output signal Q100 in the present disclosure is not speeded up. Compared to the aforementioned related approaches, the present disclosure can only adjust the rising time of the output signal Q100 to achieve the purpose of unidirectional acceleration. Accordingly, when an analog circuit needs the unidirectional acceleration, the standard cell logic gate 110 in the present disclosure can be applied to this analog circuit.

Since the standard cell logic gate 120 has a similar structure and similar operations, they are not described herein again.

Figure 3:
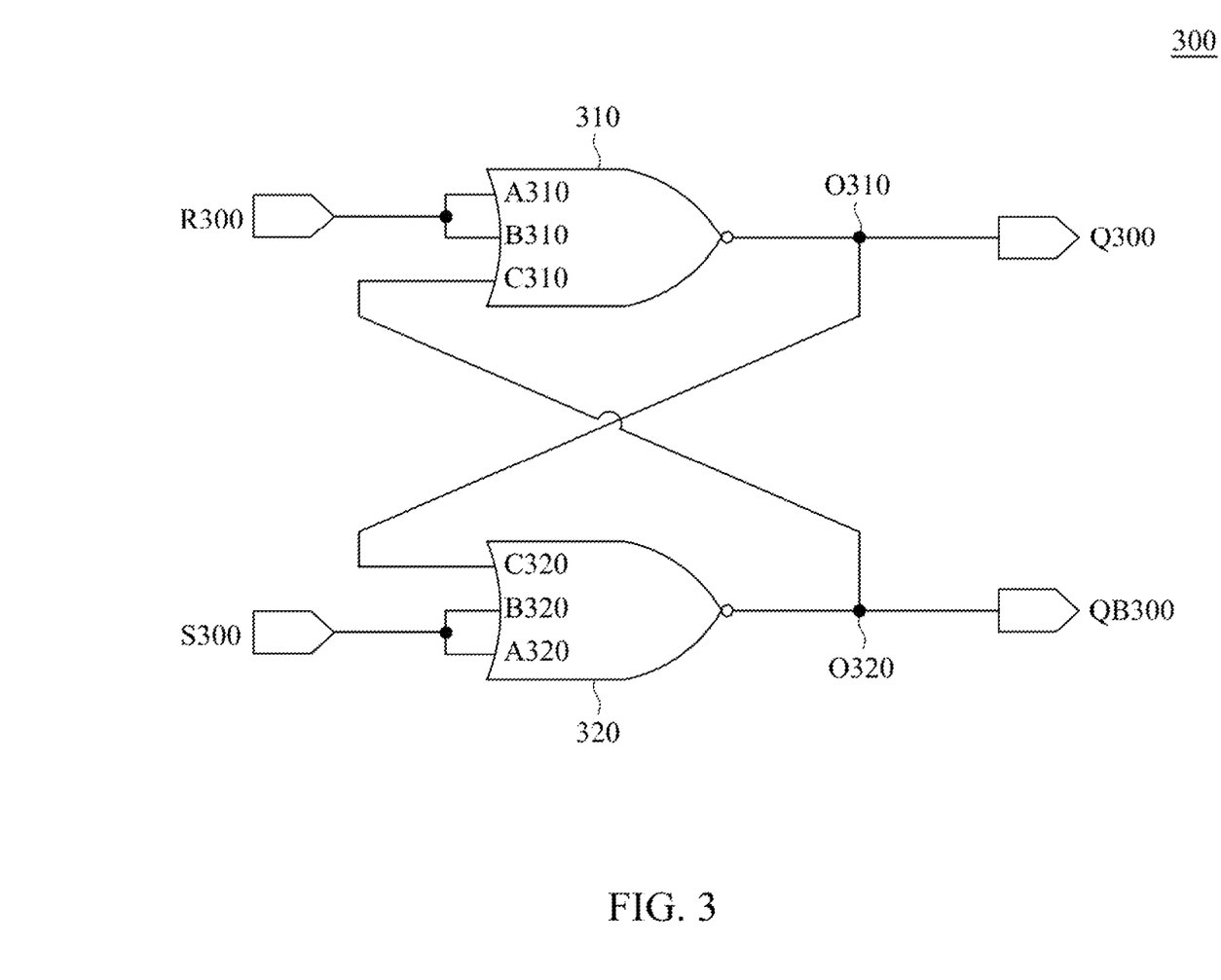
FIG. 3 is a schematic diagram of a latch according to some embodiments of the present disclosure.

Reference is made to FIG. 3. FIG. 3 is a schematic diagram of a latch 300 according to some embodiments of the present disclosure. As illustrated in FIG. 3, the latch 300 includes a standard cell logic gate 310 and a standard cell logic gate 320. The standard cell logic gate 310 and the standard cell logic gate 320 are coupled to each other.

In the example of FIG. 3, the standard cell logic gate 310 and the standard cell logic gate 320 are three-input NOR gates (NOR3). In other words, the standard cell logic gate 310 includes three input terminals A310, B310, C310 and one output terminal O310. The standard cell logic gate 320 includes three input terminals C320, B320, A320 and one output terminal O320.

The input terminal A310 and the input terminal B310 receive an input signal R300. The input terminal C310 receives an output signal QB300. The output terminal O310 generates an output signal Q300. The input terminal C320 receives the output signal Q300. The input terminal B320 and the input terminal A320 receive an input signal S300. The output terminal O320 generates the output signal QB300. The input signal R300 can be a reset signal of the latch 300, and the input signal S300 can be a set signal of the latch 300.

Figure 4:
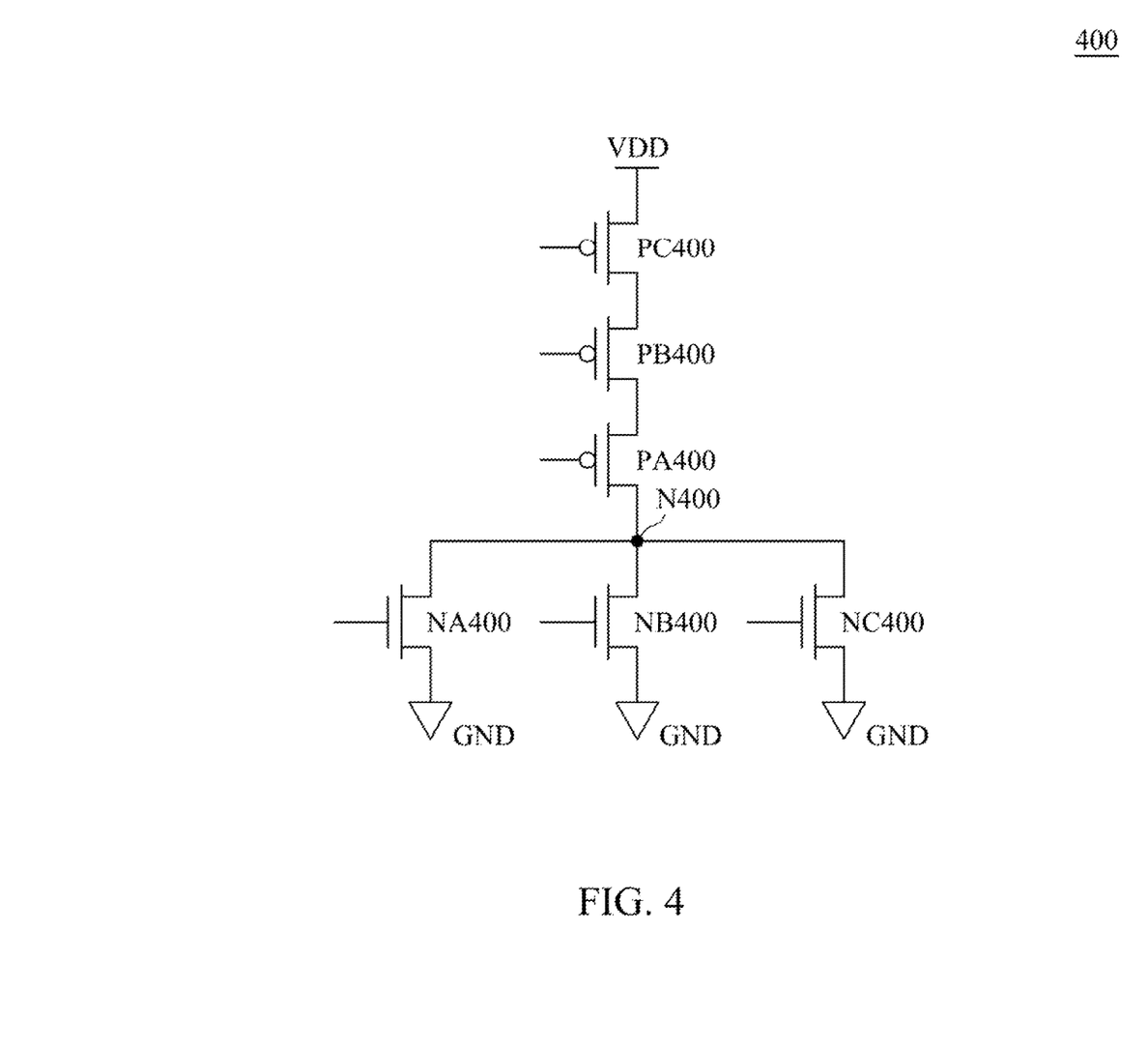
FIG. 4 is a schematic diagram of a standard cell logic gate according to some embodiments of the present disclosure.

Reference is made to FIG. 4. FIG. 4 is a schematic diagram of a standard cell logic gate 400 according to some embodiments of the present disclosure. The standard cell logic gate 400 can be used to implement the standard cell logic gate 310 or the standard cell logic gate 320 in FIG. 3.

As illustrated in FIG. 4, the standard cell logic gate 400 includes a group of transistors PA400, PB400, PC400 and includes a group of transistors NA200, NB200, NC200. Although the transistor number of each group of transistors in FIG. 4 is 3, the present disclosure is not limited thereto. In some other embodiments, the transistor number of each group of transistors can be greater than 3. In other words, the transistor number of each group of transistors is at least 3.

The transistors PA400, PB400, PC400 are P-type transistors and are coupled to each other in series. The transistors NA400, NB400, NC400 are N-type transistors (different from types of the transistors PA400, PB400, PC400) and are coupled to each other in parallel. The transistors PA400, PB400, PC400 and the transistors NA400, NB400, NC400 are coupled in series at a node N400, and coupled between the power source VDD and the ground terminal GND. The transistor PC400 is directly coupled to the power source VDD, and the transistors NA400, NB400, NC400 are directly coupled to the ground terminal GND.

In some embodiments, sizes of the transistors PA400, PB400, PC400 are identical to each other, sizes of the transistors NA400, NB400, NC400 are identical to each other, but the present disclosure is not limited thereto.

When the standard cell logic gate 310 in FIG. 3 is implemented by the standard cell logic gate 400, a gate terminal of the transistor PA400 and a gate terminal of the transistor NA400 correspond to the input terminal A310 and receive the input signal R300. A gate terminal of the transistor PB400 and a gate terminal of the transistor NB400 correspond to the input terminal B310 and receive the input signal R300. A gate terminal of the transistor PC400 and a gate terminal of the transistor NC400 correspond to the input terminal C310 and receive the output signal QB300. The node N400 corresponds to the output terminal O310 and generates the output signal Q300.

When the standard cell logic gate 320 in FIG. 3 is implemented by the standard cell logic gate 400, the gate terminal of the transistor PA400 and the gate terminal of the transistor NA400 correspond to the input terminal A320 and receive the input signal S300. The gate terminal of the transistor PB400 and the gate terminal of the transistor NB400 correspond to the input terminal B320 and receive the input signal S300. The gate terminal of the transistor PC400 and the gate terminal of the transistor NC400 correspond to the input terminal C320 and receive the output signal Q300. The node N400 corresponds to the output terminal O320 and generates the output signal QB300.

Taking the standard cell logic gate 310 as an example, when the input signal R300 has a higher logic value, the transistors NA400 and NB400 are turned on and the transistors PA400 and PB400 are turned off. Accordingly, the voltage of the output signal Q300 at the node N400 is pulled down by the ground terminal GND through the two turned-on transistors NA400 and NB400. Based on similar principles, compared to some related approaches, the falling time of the output signal Q300 in the present disclosure can be speeded up (the falling time is shorter) and can only adjust the falling time of the output signal Q300 to achieve the purpose of unidirectional acceleration.

Since the standard cell logic gate 320 has a similar structure and similar operations, they are not described herein again.

Figure 5:
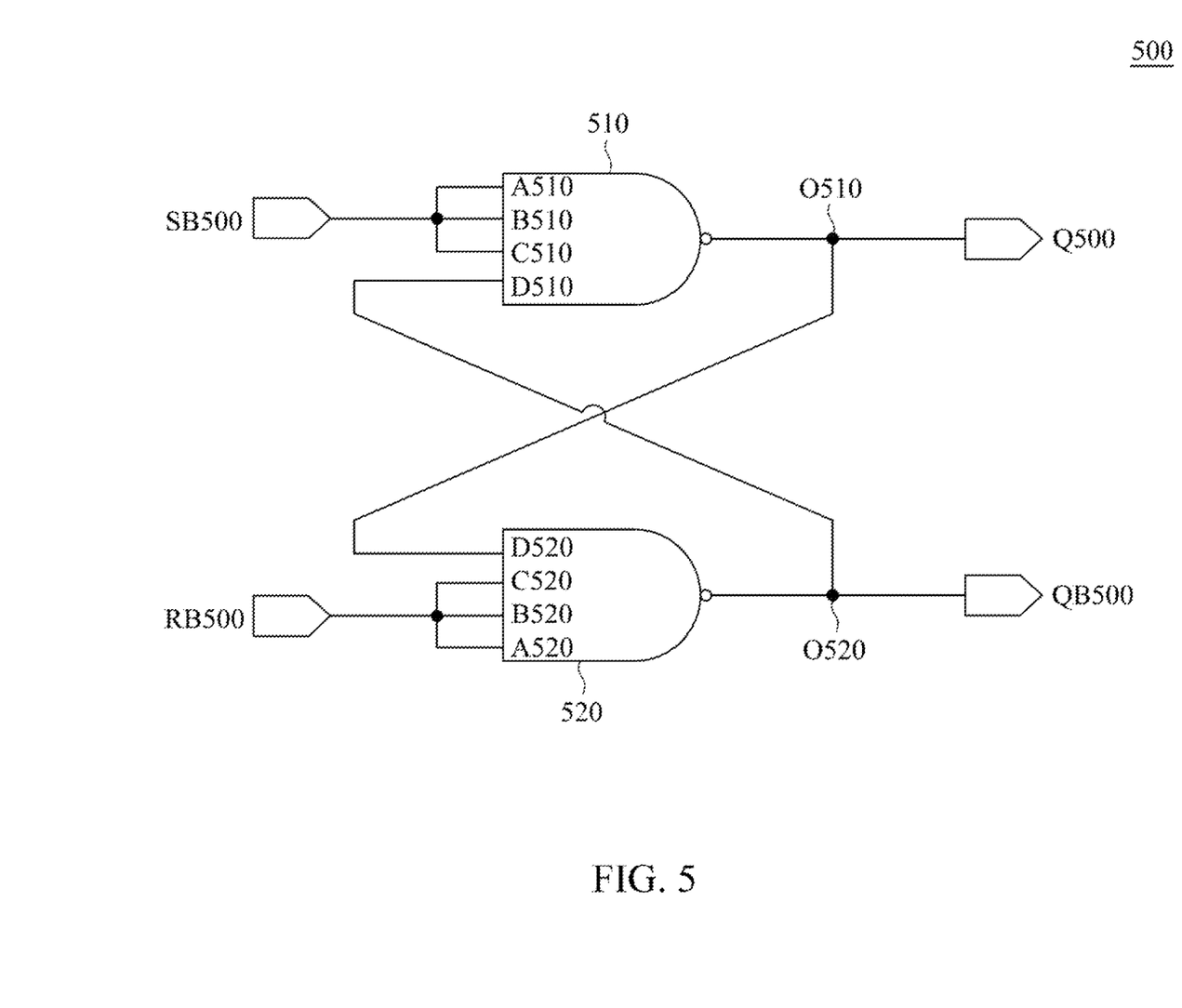
FIG. 5 is a schematic diagram of a latch according to some embodiments of the present disclosure.

Reference is made to FIG. 5. FIG. 5 is a schematic diagram of a latch 500 according to some embodiments of the present disclosure. As illustrated in FIG. 5, the latch 500 includes a standard cell logic gate 510 and a standard cell logic gate 520. The standard cell logic gate 510 and the standard cell logic gate 520 are coupled to each other.

In the example of FIG. 5, the standard cell logic gate 510 and the standard cell logic gate 520 are four-input NAND gates (NAND4).

Figure 6:
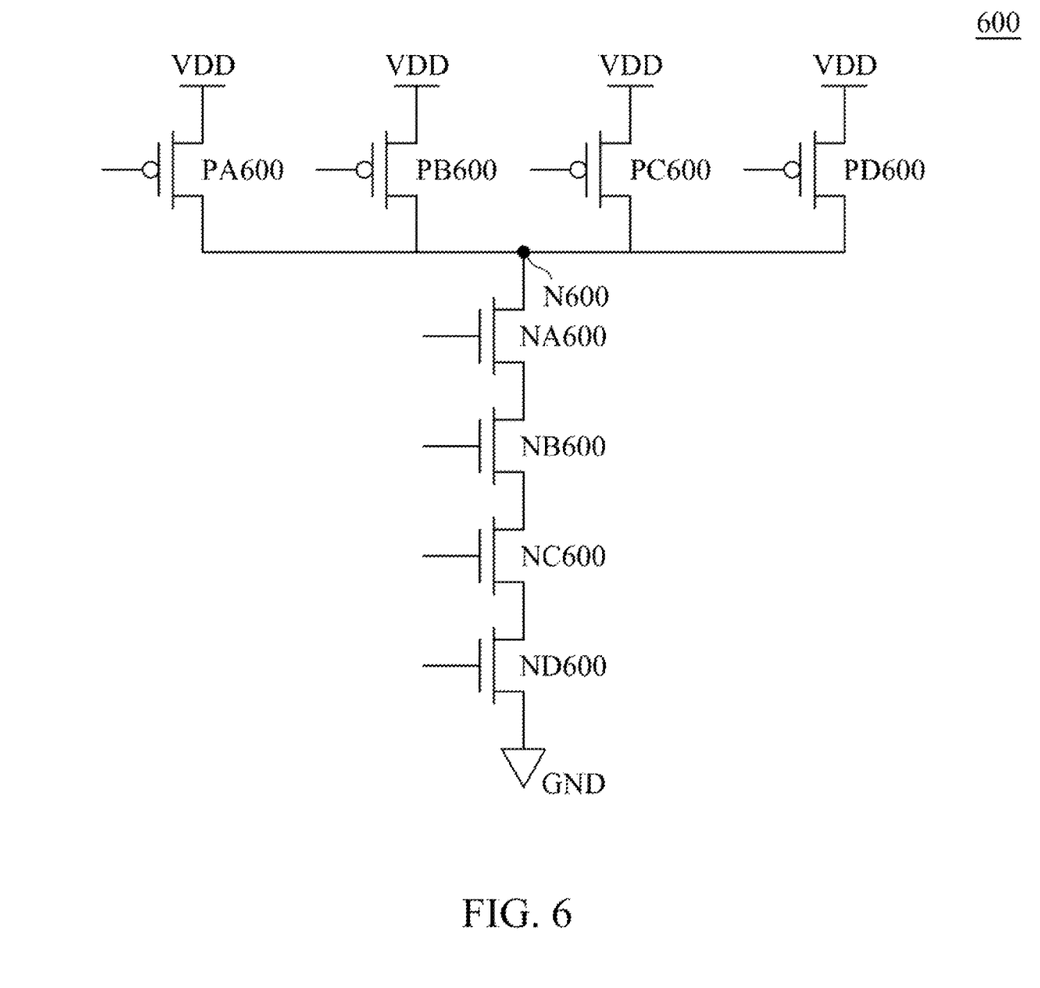
FIG. 6 is a schematic diagram of a standard cell logic gate according to some embodiments of the present disclosure.

Reference is made to FIG. 6. FIG. 6 is a schematic diagram of a standard cell logic gate 600 according to some embodiments of the present disclosure. The standard cell logic gate 600 can be used to implement the standard cell logic gate 510 or the standard cell logic gate 520 in FIG. 5. In the standard cell logic gate 600, the transistor number of each group of transistors (e.g., the group of transistors coupled in parallel or the group of transistors coupled in series) is 4.

When the standard cell logic gate 510 in FIG. 5 is implemented by the standard cell logic gate 600, a gate terminal of a transistor PA600 and a gate terminal of a transistor NA600 correspond to an input terminal A510 and receive an input signal SB500. A gate terminal of a transistor PB600 and a gate terminal of a transistor NB600 correspond to an input terminal B510 and receive the input signal SB500. A gate terminal of a transistor PC600 and a gate terminal of a transistor NC600 correspond to an input terminal C510 and receive the input signal SB500. A gate terminal of a transistor PD600 and a gate terminal of a transistor ND600 correspond to an input terminal D510 and receive an output signal QB500. A node N600 corresponds to an output terminal O510 and generates an output signal Q500.

The voltage of the output signal Q500 is pulled up by the power source VDD through the three turned-on transistors PA600, PB600, PC600. Compared to the latch 100 (pulled up through two turned-on transistors), the rising time of the output signal Q500 of the latch 500 is further faster (the rising time is further shorter).

When the standard cell logic gate 520 in FIG. 5 is implemented by the standard cell logic gate 600, the gate of the transistor PA600 and the gate of the transistor NA600 correspond to an input terminal A520 and receive an input signal RB500. The gate terminal of the transistor PB600 and the gate terminal of the transistor NB600 correspond to an input terminal B520 and receive the input signal RB500. The gate terminal of the transistor PC600 and the gate terminal of the transistor NC600 correspond to an input terminal C520 and receive the input signal RB500. The gate terminal of the transistor PD600 and the gate terminal of the transistor ND600 correspond to an input terminal D520 and receive the output signal Q500. A node N600 corresponds to an output terminal O520 and generates the output signal QB500.

Since the standard cell logic gate 520 has a similar structure and similar operations, they are not described herein again.

Figure 7:
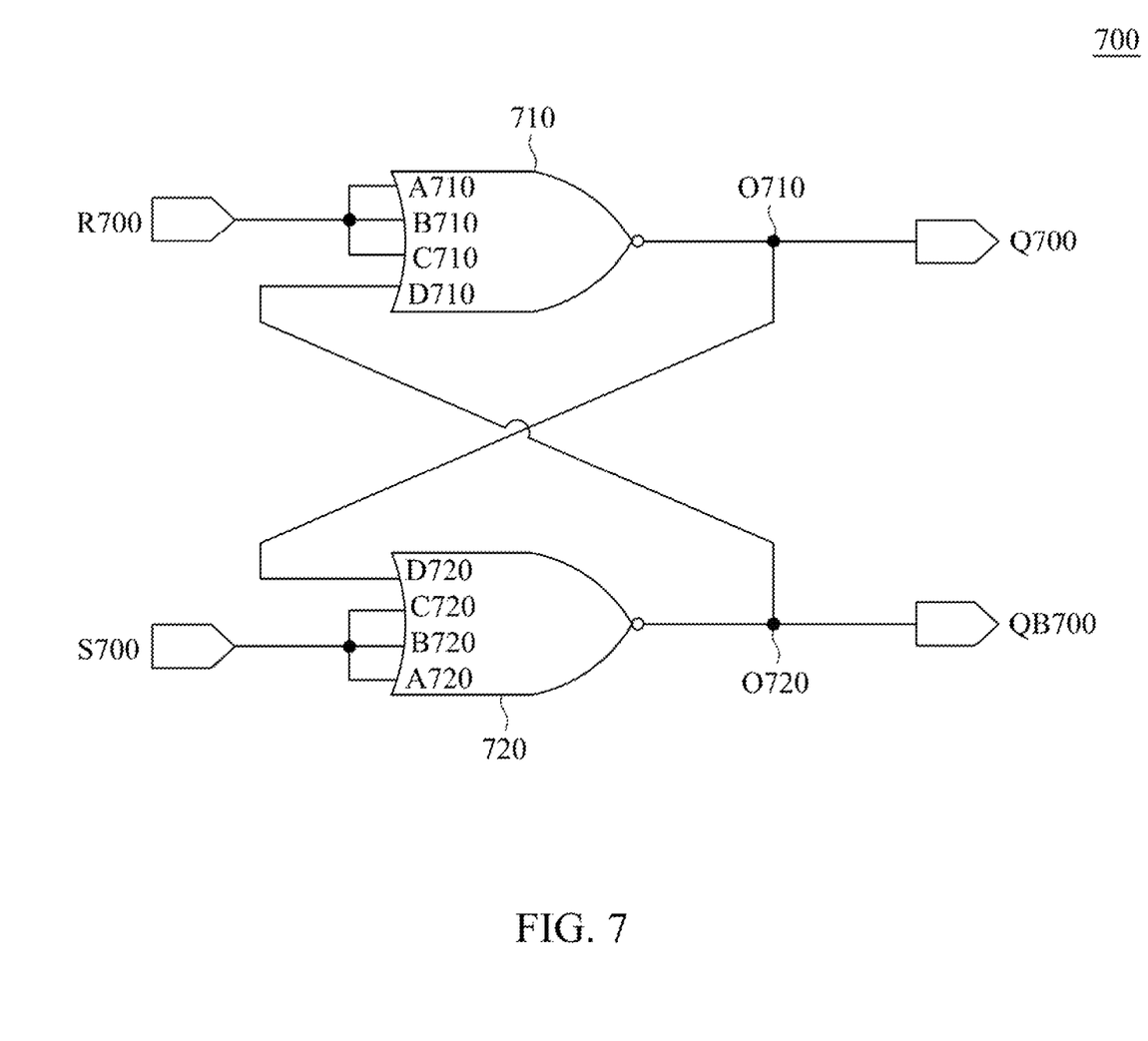
FIG. 7 is a schematic diagram of a latch according to some embodiments of the present disclosure.

Reference is made to FIG. 7. FIG. 7 is a schematic diagram of a latch 700 according to some embodiments of the present disclosure. As illustrated in FIG. 7, the latch 700 includes a standard cell logic gate 710 and a standard cell logic gate 720. The standard cell logic gate 710 and the standard cell logic gate 720 are coupled to each other.

In the example of FIG. 7, the standard cell logic gate 710 and the standard cell logic gate 720 are four-input NOR gates (NOR4).

Figure 8:
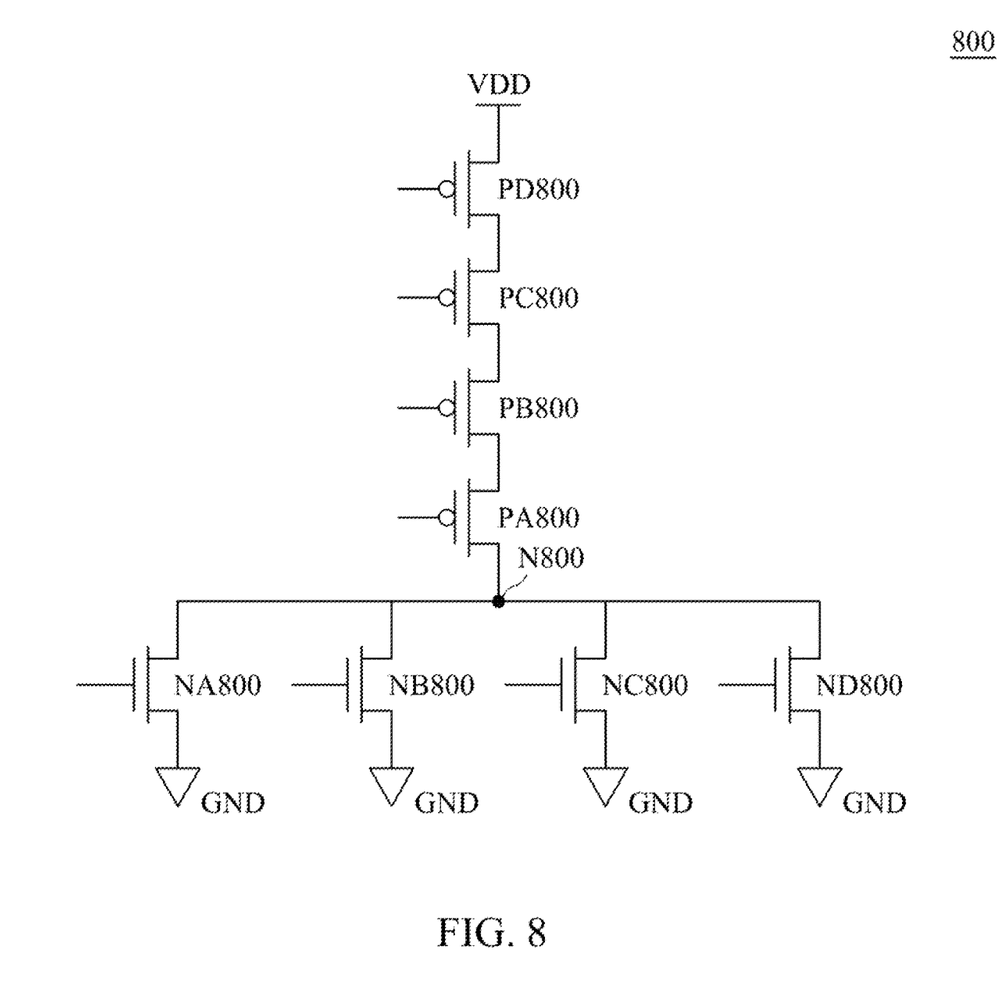
FIG. 8 is a schematic diagram of a standard cell logic gate according to some embodiments of the present disclosure.

Reference is made to FIG. 8. FIG. 8 is a schematic diagram of a standard cell logic gate 800 according to some embodiments of the present disclosure. The standard cell logic gate 800 can be used to implement the standard cell logic gate 710 or the standard cell logic gate 720 in FIG. 7. In the standard cell logic gate 800, the transistor number of each group of transistors (e.g., the group of transistors coupled in parallel or the group of transistors coupled in series) is 4.

When the standard cell logic gate 710 in FIG. 7 is implemented by the standard cell logic gate 800, a gate terminal of a transistor PA800 and a gate terminal of a transistor NA800 correspond to an input terminal A710 and receive an input signal R700. A gate terminal of a transistor PB800 and a gate terminal of a transistor NB800 correspond to an input terminal B710 and receive the input signal R700. A gate terminal of a transistor PC800 and a gate terminal of a transistor NC800 correspond to an input terminal C710 and receive the input signal R700. A gate terminal of a transistor PD800 and a gate terminal of a transistor ND800 correspond to an input terminal D710 and receive an output signal QB700. A node N800 corresponds to an output terminal O710 and generates an output signal Q700.

The voltage of the output signal Q700 is pulled down by the ground terminal GND through the three turned-on transistors NA800, NB800, NC800. Compared to the latch 300 (pulled down through two turned-on transistors), the falling time of the output signal Q700 in the latch 700 is further faster (the falling time is further shorter).

When the standard cell logic gate 720 in FIG. 7 is implemented by the standard cell logic gate 800, the gate terminal of the transistor PA800 and the gate terminal of the transistor NA800 correspond to an input terminal A720 and receive an input signal S700. The gate terminal of the transistor PB800 and the gate terminal of the transistor NB800 correspond to an input terminal B720 and receive the input signal S700. The gate terminal of the transistor PC800 and the gate terminal of the transistor NC800 correspond to an input terminal C720 and receive the input signal S700. The gate terminal of the transistor PD800 and the gate terminal of the transistor ND800 correspond to an input terminal D720 and receive the output signal Q700. The node N800 corresponds to an output terminal O720 and generates the output signal QB700.

Since the standard cell logic gate 720 has a similar structure and similar operations, they are not described herein again.

Figure 9:
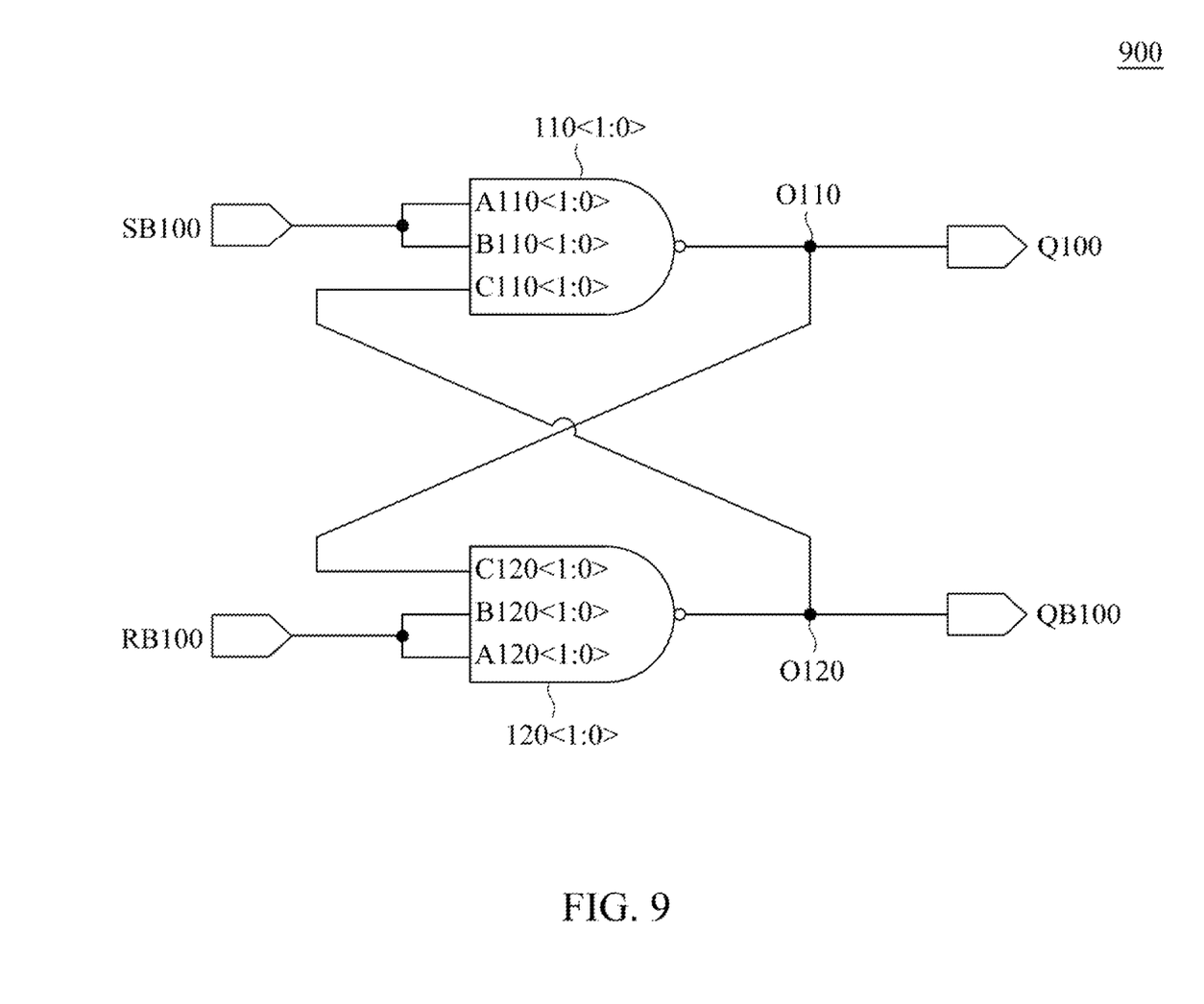
FIG. 9 is a schematic diagram of a latch according to some embodiments of the present disclosure.

Reference is made to FIG. 9. FIG. 9 is a schematic diagram of a latch 900 according to some embodiments of the present disclosure. The latch 900 includes two standard cell logic gates 110 in FIG. 1 (they are labeled as 110<1:0> in FIG. 9) and two standard cell logic gates 120 in FIG. 1 (they are labeled as 120<1:0> in FIG. 9). Each of the two standard cell logic gates 110 can be implemented by the standard cell logic gate 200 in FIG. 2 and the two standard cell logic gates 110 are coupled in parallel (terminals receiving or outputting the same signal are coupled together). Each of the two standard cell logic gates 120 can be implemented by the standard cell logic gate 200 in FIG. 2 and the two standard cell logic gates 120 are coupled in parallel (terminals receiving or outputting the same signal are coupled together).

In FIG. 9, input terminals A110<1:0> are first terminals of the two standard cell logic gates 110, input terminals B110<1:0> are second terminals of the two standard cell logic gates 110, and input terminals C110<1:0> are third terminals of the two standard cell logic gates 110. Input terminals C120<1:0> are first terminals of the two standard cell logic gates 120, input terminals B120<1:0> are second terminals of the two standard cell logic gates 120, and input terminals A120<1:0> are third terminals of the two standard cell logic gates 120.

The voltage of the output signal Q100 in FIG. 9 is pulled up by the power source VDD through four turned-on transistors (two transistors PA200 and two transistors PB200). Compared to the latch 100 (pulled up through two turned-on transistors), the rising time of the output signal Q100 in the latch 900 is further faster (the rising time is further shorter).

Figure 10:
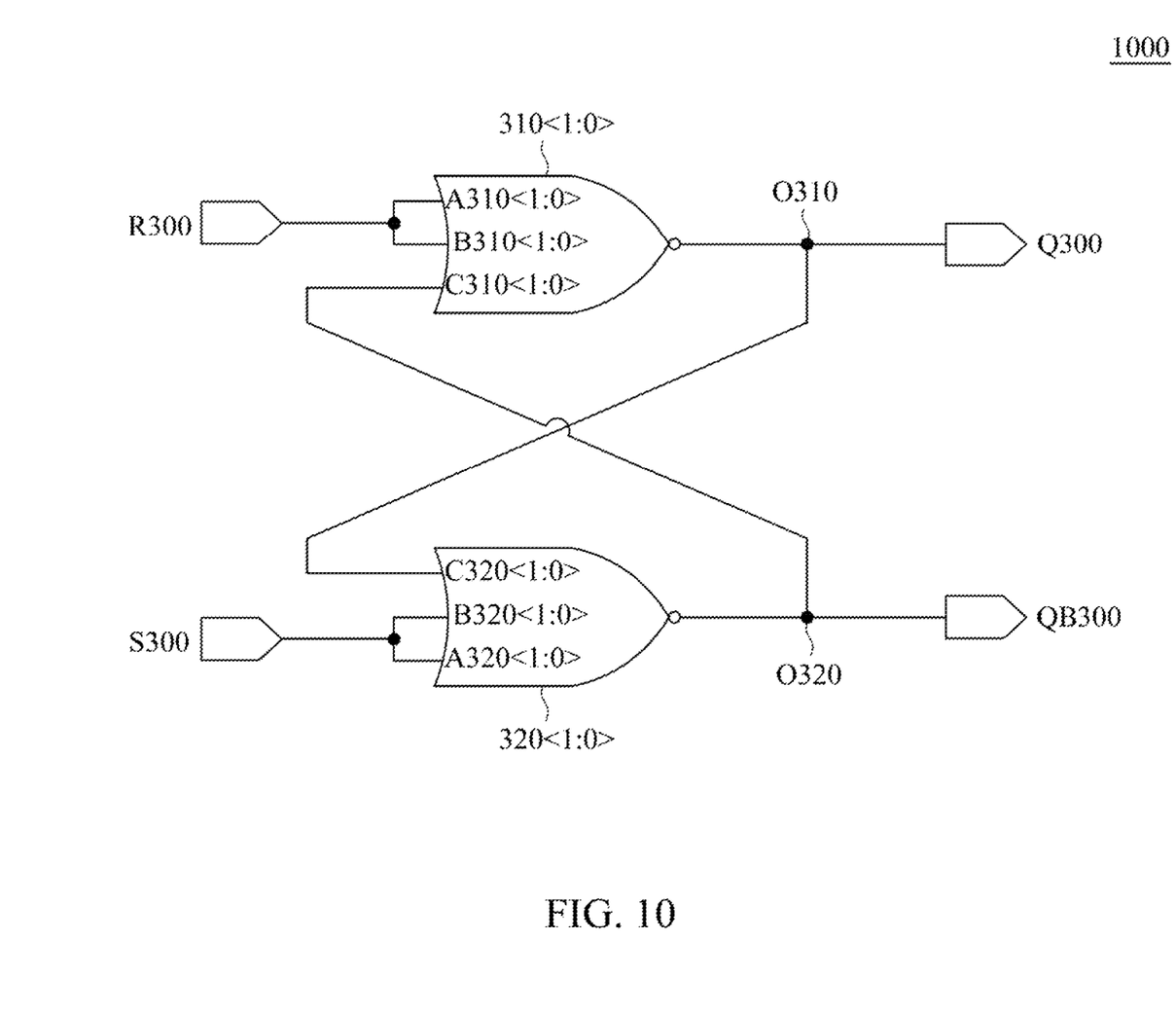
FIG. 10 is a schematic diagram of a latch according to some embodiments of the present disclosure.

Reference is made to FIG. 10. FIG. 10 is a schematic diagram of a latch 1000 according to some embodiments of the present disclosure. The latch 1000 includes two standard cell logic gates 310 in FIG. 3 (they are labeled as 310<1:0> in FIG. 10) and two standard cell logic gates 320 in FIG. 3 (they are labeled as 320<1:0> in FIG. 10). Each of the two standard cell logic gates 310 can be implemented by the standard cell logic gate 400 in FIG. 4 and the two standard cell logic gates 310 are coupled in parallel (terminals receiving or outputting the same signal are coupled together). Each of the two standard cell logic gates 320 can be implemented by the standard cell logic gate 400 in FIG. 4 and the two standard cell logic gates 320 are coupled in parallel (terminals receiving or outputting the same signal are coupled together).

In FIG. 10, input terminals A310<1:0> are first terminals of the two standard cell logic gate 310, input terminals B310<1:0> are second terminals of the two standard cell logic gates 310, and input terminals C310<1:0> are third terminals of the two standard cell logic gates 310. Input terminals C320<1:0> are first terminals of the two standard cell logic gates 320, input terminals B320<1:0> are second terminals of the two standard cell logic gates 320, and input terminals A320<1:0> are third terminals of the two standard cell logic gates 320.

The voltage of the output signal Q300 in FIG. 10 is pulled down by the ground terminal GND through four turned-on transistors (two transistors NA400 and two transistors NB400). Compared to the latch 300 (pulled down through two turned-on transistors), the falling time of the output signal Q300 in the latch 1000 is further faster (the falling time is further shorter).

As described above, the latch in the present disclosure is implemented by the standard cell logic gate with at least three input terminals. Accordingly, the purpose of unidirectional acceleration (the rising time or the falling time of the output signal) can be achieved.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A latch, comprising:
   at least one first standard cell logic gate, comprising:
   a first input terminal configured to receive a first input signal;
   a second input terminal configured to receive the first input signal;
   a third input terminal configured to receive a first output signal; and
   a first output terminal configured to output a second output signal; and
   at least one second standard cell logic gate, comprising:
   a fourth input terminal configured to receive the second output signal;
   a fifth input terminal configured to receive a second input signal;
   a sixth input terminal configured to receive the second input signal; and
   a second output terminal configured to output the first output signal;
   wherein one of the at least one first standard cell logic gate and the at least one second standard cell logic gate comprises at least three transistors of a same conductivity type, wherein the at least three transistors are coupled in series between the first output terminal and one of a power source and a ground terminal, wherein three of gate terminals of the at least three transistors are the first input terminal, the second input terminal, and the third input terminal, respectively.

2. The latch of claim 1, wherein each of the at least one first standard cell logic gate and the at least one second standard cell logic gate is a NAND gate.

3. The latch of claim 1, wherein each of the at least one first standard cell logic gate and the at least one second standard cell logic gate is a NOR gate.

4. The latch of claim 1, wherein the at least one first standard cell logic gate further comprises:
   a seventh input terminal configured to receive the first input signal.

5. The latch of claim 4, wherein the at least one second standard cell logic gate further comprises:
   an eighth input terminal configured to receive the second input signal.

6. The latch of claim 4, wherein the at least one first standard cell logic gate comprises two first standard cell logic gates, and the two first standard cell logic gates are coupled in parallel.

7. The latch of claim 6, wherein the at least one second standard cell logic gate comprises two second standard cell logic gates, and the two second standard cell logic gates are coupled in parallel.

* * * * *